United States Patent [19]
Moran

[11] Patent Number: 5,652,019
[45] Date of Patent: Jul. 29, 1997

[54] METHOD FOR PRODUCING RESISTIVE GRADIENTS ON SUBSTRATES AND ARTICLES PRODUCED THEREBY

[75] Inventor: William P. Moran, Tulsa, Okla.

[73] Assignee: Rockwell International Corporation, Seal Beach, Calif.

[21] Appl. No.: 541,674

[22] Filed: Oct. 10, 1995

[51] Int. Cl.$^6$ .......................................... B05D 3/02
[52] U.S. Cl. .................. 427/226; 427/58; 427/379; 427/126.1; 427/376.1; 347/69; 347/55
[58] Field of Search ................ 427/58, 101, 102, 427/121, 126.1, 226, 335, 379, 376.1; 346/140 R; 106/1.27

[56] References Cited

U.S. PATENT DOCUMENTS

| | | | |
|---|---|---|---|
| 4,845,517 | 7/1989 | Temple et al. | 346/140 R |
| 4,879,568 | 11/1989 | Bartky et al. | 346/140 R |
| 5,002,824 | 3/1991 | Warren | 428/290 |
| 5,041,306 | 8/1991 | Warren | 427/126.1 |
| 5,268,024 | 12/1993 | Moran | 106/1.27 |

*Primary Examiner*—Shrive Beck
*Assistant Examiner*—Brian K. Talbot
*Attorney, Agent, or Firm*—Charles T. Silberberg; Lawrence N. Ginsberg; Terrell P. Lewis

[57] ABSTRACT

The invention is a method of forming a conductive coating on a structural substrate. The method involves depositing a relatively non-conductive precursor material in a solution state on the structural substrate using inkjet apparatus. The solution is dried to leave a film. Then, the dried film is heated to a level at which a chemical (pyrolysis) reaction is triggered to convert the dried precursor material to a conductive material. The precursor solution can be dried in a manner which does not result in its transformation to the conductive state, as for example through the use of microwave apparatus. The precursor material can be applied on the substrate in such a manner as to control the conductivity of the coating and to provide a coating which exhibits one of uniform characteristics, discrete patterns, or gradient characteristics.

13 Claims, 2 Drawing Sheets

METHOD FOR PRODUCING RESISTIVE GRADIENTS ON SUBSTRATES AND ARTICLES PRODUCED THEREBY

BACKGROUND OF THE INVENTION

1. Field of the Invention

The present invention relates generally to the application of resistive materials to substrates, and more particularly to a method for forming resistive gradients, patterns, and uniform coatings on substrates, as well as for incorporating such coating materials into structural laminates for radar cross section (RCS) reduction, field shaping, antennae, current control and shaping, field current and power absorption, and EMI suppression.

2. Description of the Related Art

The use of electric fields to create patterns of regularity or irregularity using various types of wet or dry media has been known for a long time.

U.S. Pat. No. 2,097,233 to Meston discloses an apparatus employing electrical deposition for coating or decorating a surface with a material which is conveyed to the vicinity of the surface as a finely divided suspension and then directly deposited on the surface in a pattern.

U.S. Pat. No. 4,545,536 to Avidon and U.S. Pat. No. 4,748,043 to Seaver et al. disclose electrostatic coating systems for applying very thin coatings of wet or dry materials on substrates.

It is also known from U.S. Pat. No. 3,992,212 to Youtsey et al. and U.S. Pat. No. 4,452,844 to Prabhu et al. to provide electrical resistor inks for use in the formation of resistors in electrical circuits in such applications as printed circuit boards and ceramic substrates bearing thick film circuits.

Against this background of known prior art, applicant has developed a new, more efficient, cost-effective process for forming resistive gradients, patterns, and uniform coatings on woven or porous substrates using an inkjet application apparatus and an inorganic conducting polymer (ICP) developed by the assignee of the present invention, and described in greater detail below.

OBJECTS AND SUMMARY OF THE INVENTION

It is therefore an object of the present invention to provide a novel method for applying conductive materials to substrates in order to form resistive gradients, patterns and uniform coatings, while overcoming all the deficiencies and drawbacks of other related processes currently known.

Another object of the invention is to provide a novel method for producing resistive gradients, patterns, and uniform resistive sheets with great accuracy as well as in a variety of lengths and widths and functional forms.

Another object of the invention is to provide a novel method for accurately producing resistive gradients and uniform resistive sheets using an inorganic conductive polymer (ICP) material which can be deposited by an inkjet method on structural substrates in a variety of lengths and widths and functional forms.

Another object of the invention is to provide a novel inkjet method for separately controlling the conductivity at a predetermined location on a substrate while maintaining the geometric and volumetric accuracy of the delivery system.

Still another object of the invention is to provide a method for producing a broad range of resistivities of from about 3 ohms per square to about 5000 ohms per square on a variety of substrates with regions of differing resistivity arbitrarily spaced and/or oriented relative to one another.

Still another object is to provide an efficient method for fabricating gradient and uniform coatings of conductive material on structural sheets which achieves significant cost and time savings, facilitates flexibility of design, improves RCS performance and eliminates volatile organic solvents.

Yet another object is to provide a method of coating a substrate which overcomes the inherent lack of precision in both the amount and position of application, when compared with methods for spraying liquids or powders.

These and other objects are attained through the deposition of a unique precursor material in a solution state on a structural fabric substrate using inkjet apparatus.

The precursor material is first applied in solution to the substrate. In this state, the precursor material is relatively non-conductive. Then, the solution is dried. Finally, the dried material is heated, during which a chemical reaction is triggered to convert the dried precursor material to an Inorganic Conductive Polymer (ICP). The ICP-containing solution can be dried in a manner which does not result in its transformation to a conductive state, as for example through the use of microwave apparatus. The ICP-containing material on the substrate can be applied in such a manner as to result in a coating which exhibits either uniform characteristics, discrete patterns, or gradient characteristics.

DETAILED DESCRIPTION OF THE INVENTION

Figure 1:
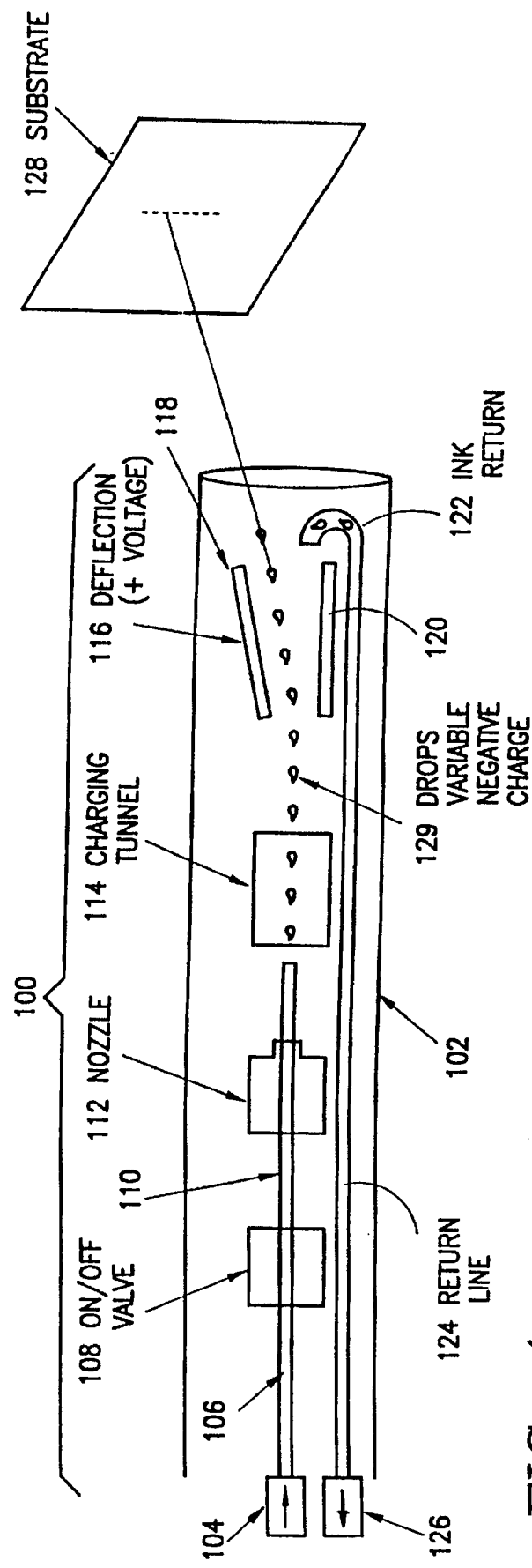
FIG. 1 is schematic view of one embodiment of an apparatus useful in carrying out the method of the present invention.

The following detailed description is of the best currently contemplated modes of carrying out the invention. The description is not to be taken in a limiting sense, but is made merely for the purpose of illustrating the general principles of the invention, since the actual scope of the invention can be best determined by the appended claims. The conductive material used in the present invention is the Inorganic Conducting Polymer (ICP) developed by the assignee of the present invention. The ICP material is disclosed in U.S. Pat. Nos. 5,041,306 and 5,002,824 (both issued to Warren, and the disclosures of these patents are incorporated herein by reference.

As disclosed in the above-referenced patents formation of the ICP material starts with a precursor which is a true solution. The solution is applied to a fiberglass or cloth substrate, and penetrates the entire yarn bundle of the fabric. Solvent evaporates leaving a thin glassy solid film. The film is transformed to the conducting phase by a thermal shock which triggers a pyrolysis reaction of the components to form the ICP. The final form of the conducting layer is a thin adherent coating on the individual fibers of the substrate. The end product is a non-stoichiometric mixture of metal sulfides and products of pyrolysis.

A resistive structural coating must satisfy a large number of requirements. Depending on the electrical application, it must meet tolerances on conductivity and position. The size of the resistive sheet is of importance to RCS because seams can be detrimental to performance. The value of resistive gradients in controlling electromagnetic wave transitions to and from currents lies in the precise control of those currents through the resistance of the surface carrying the currents.

Such precise control requires (1) exact variations of the resistance to affect the electric and magnetic fields associated with the currents, (2) precise control of the rate of change of the currents with respect to all three spatial dimensions, and (3) precise control of the relative magnitude of the real and imaginary parts of the surface impedance. For simplicity, resistive gradients on substrates are referred to as "R-cards". Uniform resistive sheets and patterned resistive sheets also function to control the magnitude and phase, and rates of change of currents in other cases. Since all three spatial dimensions are significant in forming and controlling current distributions, the gradients are often defined in two and three dimensions, not just one. This places even more severe constraints on the materials and the processes for forming such electrically tailored body surfaces. This invention shows such a process with actual materials which are not only electrically defined, but which are also structural at the same time.

The combination of the method of application of the present invention, which affords dilution control of conductivity of the ICP, with subsequent processing steps for structural composites provides a unique method for achieving large scale precision control of wave-current interactions in all branches of electromagnetic arts.

When considering the coating as part of a laminate, there are also requirements to survive prepregging, layup and cure cycles. Weight and volume are critical in some applications as well, such as in the fabrication of aero-structures. These requirements must be met from the outset by the application process.

The principal advantage of the ICP material system of the present invention is that the conductivity is primarily determined by the amount of precursor applied per unit area. For the ICP system, and almost for no other, conductivity can be controlled by the dilution of the precursor. Dilution of pigmented conductive inks is a poor method for controlling conductivity.

In a typical R-card of 5 to 2500 ohms per square over a distance of an inch to several feet, the application process must be able to meter out and position 500 times more material at one end of the card than at the other end. While this has been previously accomplished by spraying methods, the method of the present invention exhibits the advantages of speed, accuracy, reproducibility and versatility.

Tolerances for uniformly coated cards can be more demanding than for cards with gradients due to the added complication of the position to which the resistance is assigned. In such a situation, it is not unusual to encounter customer-required tolerances of ±5% for ohms values of from 10 to 1000, ±10% for ohm values of from 1000 to 2000, ±15% for ohm values of over 2000.

Tolerances other than simple plus or minus percents are often specified for specific parts of a card. For example, the tip resistance may have strict lower bounds, but relaxed upper bounds. The opposite applies to the resistance of the conductive margin which couples to the ground plane. Some point values are more critical than others.

In some cards, coatings are intentionally designed to include steps. The position and values at the step must be tightly controlled. In dual R-cards, i.e., those which have two gradients abutting at the high or low resistance ends, the proper spatial relation between the two regions must be maintained in order that both function, and both fit the underlying part without seams.

Typical electrical tolerances are usually recited as a percent of the theoretical value with little regard for the relationship to the position accuracy this implies. The application system and the measurement system often fail to meet some of the nominal tolerances which are set forth. Typical tolerances are small when the values are small and are relaxed at higher values. Ten percent is often asked for at low R values. For example, in the case of a card having a gradient spanning the range of 10 ohms to 2500 ohms per square over a distance of 6 inches, the resistance at any distance "x" is determined in accordance with the expression:

$$R(x) = 2490 * (x/6)^2 + 10$$

Thus, at x=0 inches, the resistance is 10 ohms/square, while at x=6 inches, the resistance is 2500 ohms/square.

The 10% tolerance at the low end of the card represents a requirement to identify the resistance position to 0.014 inch. This, in turn, implies the ability to resolve resistances to better than ±0.005 inch to ensure that a good card is not rejected because of positioning errors instead of resistance errors. The position tolerance only becomes 0.150 inch at the high end of the card. Tolerances for high R values may be typically 20%, but this only increases the position tolerance to 0.321 inch at the tip, where the resistance is a maximum.

The resistive sheet must have properties, such as drape, in order to be compatible with laminate layup. The drape comes from the thinness of the coating. The substrate of the invention is typically prepregged with film resin before incorporation into a stack of other prepregged plies. This film resin protects the ICP coating during handling and cutting.

The ICP coating itself is quite thin. It is estimated from scanning electron microscope photos to be a fraction of a micron. The typical glass fiber is 7 microns in diameter.

Thus, the thin coating of the ICP contributes much less than 30% of the volume of the fibers (0.5 micron coatings. The actual volume is probably much less than this based on the weight gain of the most conductive ICP. The gain is typically less than 10% of the weight of the fibers.

The dilution property of the ICP precursor is essential in utilizing the inkjet process of application contemplated by the present invention. Inkjet apparatus inherently has the ability to position drops of precise mass with great accuracy. The ICP precursor can vary the amount of conductivity without influencing the fluid properties which control droplet formation and positioning. Thus, the two requirements, namely positioning accuracy and resistance accuracy, are completely compatible and their integration represents no compromise to either.

Inkjet application apparatus is well known in the art. Applicant used an inkier application machine manufactured by Videojet, a company located in Chicago, Ill. Other machines from other sources are available which can provide similar features, including higher ink throughput, multiple jets controlled by one controller, and systems with 100–200 parallel programmable jets for very high volume printing. All of these features can be desirable in the production of resistive sheets, patterns and gradients. Some of these features may even be programmed into firmware, such as fonts, type sizes, and message length.

One desirable feature would be that of being able to directly address the computer so that the deposition of each and every drop could be controlled, rather than merely relying on "canned" software typically provided with commercial apparatus for controlling the deposition process. Other machine features are desired for their ability to facilitate commercial marking, as for example, the elaborate viscosity control and ink recovery systems which permit long term operation of the jet apparatus whether writing or not without changing the ink composition due to the droplet evaporation during the continual formation, flight and recycling of drops.

FIG. 1 shows an inkjet apparatus 100 of the type which may be used in carrying out the process of the present invention, and reference to that Figure should be made in connection with the following description.

The apparatus 100 includes a an inkjet head housing 102 within which is located a source 104 of the ICP precursor solution. The source typically includes a pump or other pressure-generating device so that the solution in the tank is constantly under pressure. The solution is forced from the source 104 through a conduit 106 to a solution flow control valve 108 which simply turns the flow on and off at the beginning and end of a printing session. From there, the solution flows through a conduit 110 to a nozzle station 112 where the solution stream is broken or divided into a stream of discrete drops. The drops are formed as a result of the presence of an acoustic standing wave which has been impressed on the fluid stream in the nozzle station 112. The stream of drops next passes to a charging tunnel station 114 where a negative charge is imposed on the fluid drops. The charge accumulates in the tip of the stream so that the drop which breaks off is of net negative charge. The voltage on the tunnel 114 can be varied by the controller so that the drops can vary in negative charge. The drops pass to deflection station 116 where they enter a deflection field defined between a plate 118 and a grounded plate 120. In this field, the drops are deflected from their path of travel by an angle proportional to their charge and the deflection voltage. The voltage on plate 118 is used to adjust the overall height of the character being printed. Drops which are not to be printed travel in a straight line into the ink return catcher block 122. This fluid is drawn by vacuum through a tube 124 and connecting reservoir 126 where the fluid is held for return to the supply 104. FIG. 1 also shows a substrate 128 located downstream (i.e., in front) of the deflected fluid stream of drops. For horizontal raster of the character, either the substrate or the inkjet head assembly 100 may be moved, one relative to the other. The head assembly or the substrate can be moved uniformly or non-uniformly, depending on whether a constant or variable drop density is sought.

One apparatus for moving the inkjet head assembly is a bed on which the housing 102 sits, where the bed is capable of motion in one, if not two, planar directions. Another form of such a device is an arm which is capable of pivoting such that the printing head sweeps back and forth in a horizontal plane. The print head can be rotated through an arc to cause the row of drops to form a curve set of lines of drops along a predetermined contour.

In the preferred embodiment of the inkjet apparatus, a stream of charged droplets is delivered to any one of 24 vertical locations. The action is identical to the vertical axis of an oscilloscope. The horizontal motion of the head or substrate creates the other axis of the raster. The apparatus can be programmed so that the characters fill all or a part of a 16-dot (wide) by 24-dot (tall) array. Optionally, every one of the positions can be preprogrammed and stored, each as a special character. Several special characters can be combined into a message, and the messages could also be appended to one another.

One application of the process of the invention is directed to printing continuous lines. For this application, a special character has been used—a solid line with feathered edges. The printed lines are overlapped to create a seamless, uniform coverage of precursor droplets. These blend by capillary action on the substrate. The droplet size and placement are completely independent of the concentration of the precursor so the geometry of the deposited resistive pattern does not interact with the value of the resistance. This property, i.e., the independence of the positioning of the material and the ultimate conductivity of the material, is shared by no other known conductive system, and is due to the effect on fluid properties of changes in pigment or loading. Conductive systems such as carbon or metal pigmented inks have very great sensitivity to the amount of pigment. This changes not only the theology of the fluids, and therefore the way they react to the forces of application, but also the conductivity changes exponentially with the loading.

The preferred apparatus produces a fluid flow of about 4.5 milliliters/minute or 0.075 ml/sec. This stream is broken into 66,000 drops per second by ultrasonic crystal drive of the nozzle. The size of the drops is extremely uniform because the size is determined by the frequency, the nozzle size, and the fluid pressure. The fluid drops move at identical speeds. This phenomena is made possible by the continuous internal viscosity control of the ink. The character height is controlled by selection of the deflection force within the unit and by the choice of separation between the print head and the substrate. The character width is controlled by the speed of the substrate and the vertical stroke rate. The characters are composed of 16 vertical strokes of 24 drops each stroke. These individual strokes can be triggered from an external source. This varies the character width or synchronizes the width with variations in the speed of the substrate.

Character tilt, on the other hand, is a function of the character height and substrate speed, and can be eliminated by tilting the vertical raster by rotating the print head. The vertical strokes can be programmed internally, or synchronized to the position of the substrate by an encoder input. The speed of the substrate, altered for convenience and not necessity, is scaled by choosing the vertical and horizontal drop spacing to be the same. The most preferable substrate speed is 1.5 meters/second at a character height of 0.12 cm (0.5 inch). Coverage at this speed and character height is typically 190 cm$^2$/sec.

The volume of one drop has been measured at about $10^{-6}$ ml. The effective drop diameter is $12.8*10^{-3}$ cm or about 5 mils. The drop density at the speed and size described above is 360 drops per cm$^2$. The resulting spacing between drops is $5.3*10^{-2}$ cm center-to-center, or four times the drop diameter. The drop diameter is 18 times the filament diameter (E225 fibers). There is enough liquid volume in the drops to cover one square centimeter to a depth of about $4*10^{-4}$ cm. The surface area of the filaments of this cloth (style 2116) total 250 square centimeters per cm$^2$ of cloth area. The result is that the ICP precursor is distributed in an even thinner layer of 150 nanometers thickness for one pass at the substrate speed of 1.5 meters per second. Tests run at 1.0 foot per second produced wet film thicknesses on the order of 750 nanometers, or 10% of the fiber diameter. The undiluted precursor produced 200 ohms per square at this film thickness.

The inkjet apparatus can achieve high production rates by jetting onto a moving substrate on a bed or on a roll-to-roll substrate. The size of the bed or roll, and the speed and resolution are chosen to suit the positioning accuracy required by the article being made.

The application head of the inkjet apparatus can emit material either vertically downward, vertically upward, or horizontally. In production, all such orientations of the inkjet head are contemplated. Some of the fabrics that are used require application of the ICP to both surfaces due to the complementary weave pattern on the front and back sides of the substrate.

Use of a moving bed or a moving roll of substrate can offer the following capabilities:

(1) Horizontal printing uniformity;

(2) Relative rate of application compared to the known spray process;

(3) Control of conductivity by dilution;

(4) Smoothness of tapering;

(5) An ability to produce the required low ohm areas for the conductive margin at the ground plane;

(6) Operation without any release of organic volatiles or particulates.

(7) The ability to position different resistance values in close proximity to one another and in arbitrary patterns.

It has been found that the precursor, delivered via the inkjet process of the present invention, yields about ⅕ of the conductivity per coat that has been attained with typical spray apparatus. For example, one coat of sprayed, concentrated, ICP precursor yields conductivity measured at 40 ohms, whereas one inkjet application yields conductivity measured at 200 ohms. The difference is due primarily to the overlap of passes from the spray, since the plume is about 6 inches wide. Each location is sprayed three or four times in one coat (one inch separation between spray passes), whereas with an inkjet application, the traces only overlap in the feathered part of the pattern. Thus, the delivery rate per unit area is very comparable between the inkjet and the single pass spray. The enormously greater spatial resolution of the inkjet compared to the spray method means that the ultimate article has more flexible definition, and greater control of conductivity at each pixel. Thus, the appearance of high delivery rate of the spray is not an advantage, but in fact a disadvantage.

A similar comparison can also be made between the inkjet application and the single pass spray application where the precursor is diluted by a factor of eight. The spray process yields a conductivity of about 350 ohms, whereas the inkjet application produces a conductivity of about 1500 ohms.

Figure 2:
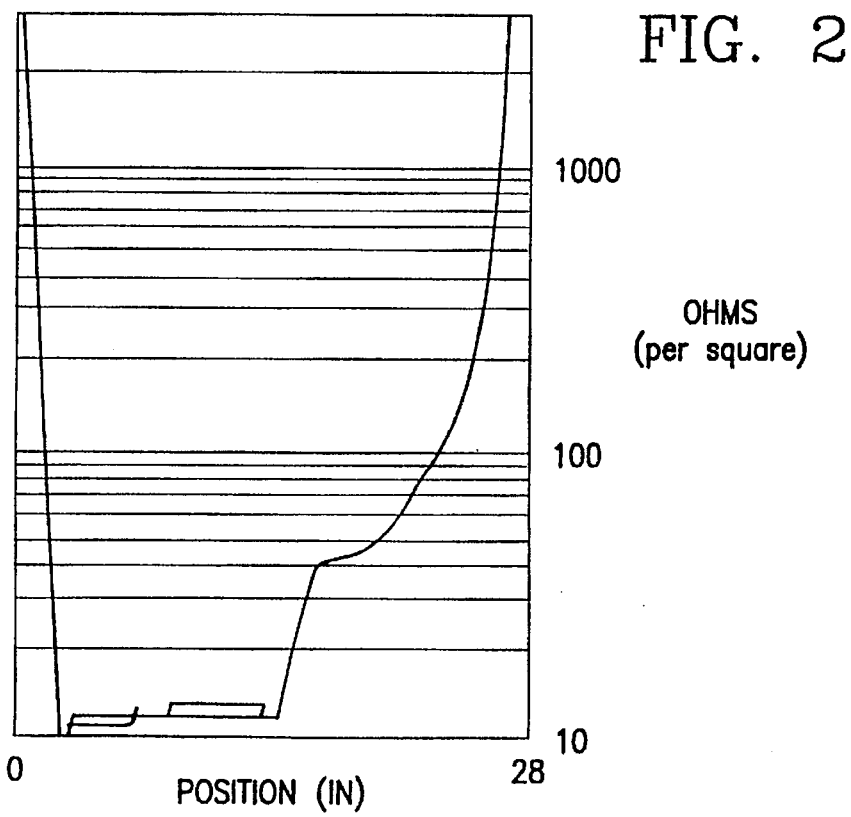
FIG. 2 is a graph showing the relationship between conductivity and position of three gradients spaced at intervals of 30 inches.

The graph of FIG. 2 shows the relationship between conductivity and position of three gradients spaced at intervals of 30 inches. These gradients demonstrate a range of achievable resistivity (from about 10 ohms to about 3000 ohms), as well as the ability to turn the curvature from positive to negative and back. FIG. 2 also shows the sharpness of the transition from uniform resistance to graded resistance, and the extreme uniformity in the direction perpendicular to the gradient at all resistance values. The measurement system used in generating this data measured the ohms per square at 0.200 inch intervals. It can be seen from FIG. 2 that there is no sign of any seams in the raw data even when the successive coats were stepped back by an inch, or when the precursor concentration was changed. The overall appearance of the resistance profile is better than with material that has been applied via a spraying process. Typically, a sprayed sample has a standard deviation of 3–10% in a region of nominally uniform material. Material applied by an inkjet apparatus has a standard deviation of between about 1 to 2 percent. In one example, a card was coated with an interleaved pattern. Every other trace was coated on the first pass, and the intermediate traces were coated on the second pass. This was done to permit each trace to spread to its maximum extent by capillary action before the spreading front encountered the adjacent trace spreading in the opposite direction. Successive coats were displaced by ±50 mils to ±100 mils in both the horizontal and vertical directions to reduce the coherence of any seam between traces.

The coating applied in this case also provided an indication of the quality of the resistance uniformity. The spray method requires a fast, rapidly evaporating solvent because of the limited liquid holding capacity and the large overlap of successive traces. On the other hand, the inkjet apparatus uses water as a solvent, and delivers much less of it at a higher concentration so the slower evaporation rate is partially compensated for by the smaller amount. On-line drying apparatus is incorporated into the final configuration of production equipment to accommodate a drying requirement.

The low ohm portion of the gradient was applied by an inkjet process to the level of 10 ohms per square, as shown in FIG. 2. This was done to compare the efficiency of the inkjet coating with the efficiency of a spray coating. The coating applied with an inkjer apparatus saved 30% or more of the weight of the precursor for comparable ohms. This is attributed to the presence in the sprayed coating of dry particles which have evaporated all of their solvent in the atomization step. These particles travel to the surface and stick, but remain isolated. The particles do not become part of the conductive coating. This higher efficiency of use of the ICP coating is one of the novel advantages of the inkjet method of the present invention. The reduced weight of the ICP material required to reach a given level of conductivity has made the structural laminates to which it has been applied stronger by as much as 50% relative to the laminates made with sprayed layers of ICP material.

Figure 3:
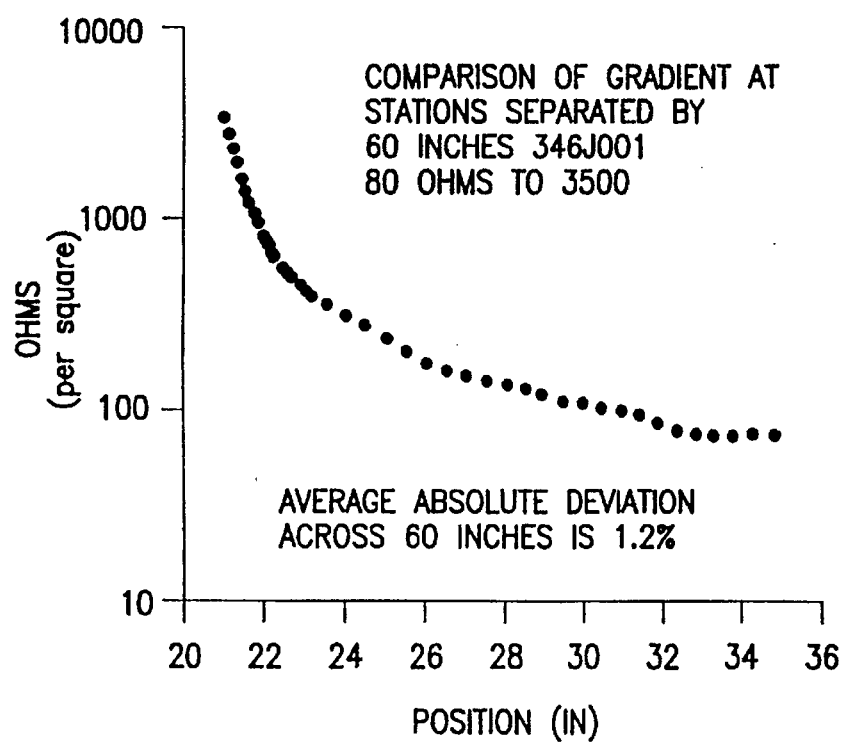
FIG. 3 is a representation of an actual gradient spanning a range of from about 80 ohms to about 3500 ohms over about 14 inches.

FIG. 3 shows an actual gradient spanning a range of about 80 ohms to about 3500 ohms over a range of about 14 inches. The Figure represents the superposition of three traces taken at intervals of 30 inches perpendicular to the gradient. The absolute variation is only 1.2%, which includes the instrument accuracy, as well as the material variations.

Figure 4:
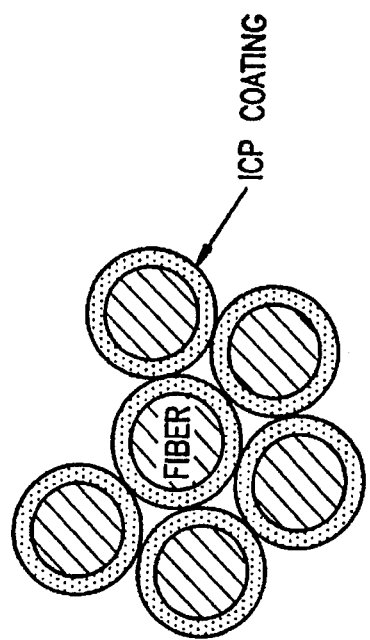
FIG. 4 is a schematic view of the manner of deposition of ICP solution on fibers of a substrate.

FIG. 4 shows the deposition of conductive ICP material on the individual fibers of a substrate. The precursor penetrates and wets the fiber surface. The ICP is formed in situ by pyrolysis as a coating on the fibers. Thus, the ICP is well supported and protected. The large surface area of the small fibers assists the ICP in achieving a wide range of resistances. The higher resistances are formed when a reduced amount of ICP is spread over a large surface area. The coating occupies minimum space and is encapsulated by the resin impregnation.

For purposes of large-scale manufacturing, the inkjet application apparatus contemplated by the present invention can integrate inkjet apparatus with stations for drying, curing, and measurement, on a single "assembly" line. The fabric handling system must provide tension control and positioning accuracy, both in distance to the inkjet head, as well as in horizontal motion. The fabric position can be sensed and encoded to synchronize the vertical strokes of the inkjet apparatus. The fabric is reversibly servo-driven, and its width is actively centered on the yells by edge sensing means. A typical fabric speed is one meter per second.

Each of the process steps of the present invention takes place at a separate station along the web. The inkjet application station(s) have three axes of coordinated motion;

down web motion, across web motion, and rotation of the jet raster. These combined degrees of freedom of motion provide for complex two-dimensional patterns on a moving or stationary web, as well as for the change of raster orientation to eliminate crowding or separation of the droplets on curved traces.

The precursor is dried as it is applied by application of low heat or microwave heating to the fabric in the proximity of the point of application. The level of heat is chosen to be sufficient to remove the solvent at the rate at which the web is moving without causing the precursor to be heated to such a level as to trigger the pyrolysis reaction.

Drying the precursor is important for several reasons. First, in order to achieve application of successive traces of the precursor material, the substrate fabric must be rolled, and then rolled again during the next application. Rolling wet fabric tends to cause changes in the precursor coat and distortion of the weave. Secondly, drying increases the achievable conductivity for a given amount of precursor, and it therefore affects uniformity, weight and strength. Thirdly, there is great value in being able to apply many coats before transforming the precursor material through pyrolysis, and wet fabric material would certainly alter the coating on adjacent fabric layers when disposed in a roll.

The ability to use microwave heating is another of the significant advantages of the method of the present invention. The precursor is not conductive so any area, regardless of the amount of precursor, will dry the same under microwave heating. Only the water solvent responds to the heating effects of the microwaves. The precursor solids are left ready for transformation to the ICP conductive state at a later time.

Other conductive systems cannot be cured through the use of microwave heating because the inks are conductive even before drying. Therefore, their response would be a complex function of the pattern deposited and the state of drying with extreme non-uniform heating as the result. Microwave breakdown occurs due to the irregular conductivity developed during uneven drying. The conductivity of these pigmented systems is very sensitive to the rate and degree of curing. This is due to the shrinkage of the film as it dries. Graded materials dry unevenly because very conductive regions tend to repel the microwaves while the very resistive regions do not heat at all or only very slowly.

Drying of the precursor takes place at drying stations. The stations are symmetrically located with respect to the application station to permit bi-directional application. The drying stations serve as means for curing and transforming the precursor to a conductive material (i.e., for converting the precursor to a conductive ICP). Curing is accomplished by one of the same drying stations, or by a separate station. Only one such curing station is required since the curing is accomplished only after all application of coating material has been finished. The step of curing or transformation requires much higher surface temperatures, and higher power input to the heating elements.

The measurement system used with the apparatus is a fixed frequency transmission system with the addition of the same three axes of motion as the application apparatus; down and cross web motions, and rotation for polarization control relative to the weave.

Additional on-line process steps can be incorporated. For example, overcoatings may be applied for specialized applications of ICP. And in some cases, the fabric surface could receive a preparatory coating before the precursor is applied. It is, however, not essential to add all of these processes to the same production line.

Detailed measurement may be better done off-line since large amounts of data are needed to characterize a typical 100 foot R-card. As many as 300,000 to 500,000 data points may be necessary to provide sufficient quality control information.

The production rate capability for graded cards is quite high. For example, a card having an 8" gradient might require 10 to 2500 ohms per square with a conductive margin of 4 inches. Thirty net yards of substrate would be needed to build one card. Using a single inkjet head to apply a string of ¼" high characters at a rate of three feet/sec, would require (on average) about 20 coats of 25 traces, or 500 traces in total. With an application time of about 35 seconds per trace, a total of 292 minutes (or roughly 5 hours) would be necessary to complete this task.

Control of conductivity requires great care in the amount of material applied, its location of application, and the subsequent transformation into a solid coating. Any step in the any of these three aspects of the method can alter the conductivity of the resulting coating. The method of the present invention is a unique combination of steps which separates the variables controlling conductivity in each of the three parts thereby increasing the ability of the operation of the apparatus to control the final product. Spray techniques do not permit ease of control of the individual drops in size, solvent content, direction or speed. Only gross averages of these variables are crudely controlled by adjustments to the equipment. Only the ICP material which is employed by the present invention affords complete separation between the drop control variables and the conductivity control variables.

Uniform coatings are made possible through the operation of many heads simultaneously. Ultimately, the entire width of a substrate could be coated in one pass. Typical speeds for a 38" wide roll of material is approximately one foot per minute, with some equipment being able to process such material at 5–8 feet per minute. Even at one foot per minute, the production capability would be 500 square yards per day.

While the present invention has been described in conjunction with specific embodiments thereof, it is evident that many alternatives, modifications, and variations will be apparent to those skilled in the art in light of the foregoing description. Accordingly, the present invention is intended to embrace all alternatives, modifications, and variations which fall within the spirit and scope of the appended claims.

What I claim is:

1. A method of forming a conductive coating on a substrate, comprising:

providing a structural substrate, providing a substantially non-conductive precursor solution containing components of an inorganic conductive polymer (ICP), diluting said precursor solution to control the dilution factor of said ICP in said solution, depositing said precursor solution, using an inkjet apparatus, onto said substrate in a controlled, continuous, stream of droplets, said precursor solution being transformable into a conductive material upon exposure to heat, drying said droplets of said solution after deposition on said substrate to produce a film of material without heating said film to such a level as to cause transformation to a conductive material, and then heating said film such that said transformation takes place resulting in a conductive coating, wherein the resistance of said conductive coating is proportional to said dilution factor of said components of said ICP.

2. The method of claim 1, wherein said step of depositing said droplets of said precursor solution comprises covering a portion of said substrate, and said step of drying said droplets of said solution comprises applying heat only to the portion of said substrate where said droplets have been applied.

3. The method of claim 1, wherein said step of heating said film to cause said transformation comprises subjecting said substrate to a level of heat which is sufficient to trigger a pyrolysis reaction.

4. The method of claim 1, wherein said controlling step comprises altering the density of application of said droplets.

5. The method of claim 1, wherein said depositing step comprises altering droplet volume, concentration and position such that said film forms a coating of conductive material on said substrate having conductivity in the range of from about 3 ohms per square to about 5000 ohms per square.

6. The method of claim 1, wherein said step of depositing said non-conductive precursor solution onto said substrate in a controlled, continuous, stream of droplets comprises directing said stream toward said substrate with a vertical motion.

7. The method of claim 6, wherein said step of directing said stream toward said substrate further includes imparting a circular motion to said stream.

8. The method of claim 6, wherein said step of directing said stream toward said substrate further includes imparting a horizontal motion to said stream.

9. The method of claim 1, wherein said step of depositing said non-conductive precursor solution onto said substrate in a controlled, continuous, stream of droplets comprises moving said substrate relative to said stream in a vertical reciprocal motion.

10. The method of claim 9, wherein said step of depositing said precursor on said substrate further includes imparting a circular motion to said substrate.

11. The method of claim 9, wherein said step of directing said precursor on said substrate further includes imparting a reciprocal horizontal motion to said substrate.

12. The method of claim 1, wherein said step of depositing said precursor on said substrate comprises applying said precursor in adjacent lines over a substantial area in such a manner that at least one gradient is formed on said substrate.

13. The method of claim 1, wherein said step of depositing said precursor on said substrate comprises applying said precursor in a pattern corresponding to at least one character having an alpha-numeric, a numeric or a geometric configuration.

* * * * *